US009300336B2

United States Patent
Giles et al.

(10) Patent No.: US 9,300,336 B2
(45) Date of Patent: Mar. 29, 2016

(54) DIRECT CONVERSION RECEIVER DEVICE WITH FIRST AND SECOND STAGES AND RELATED METHODS

(71) Applicant: HARRIS CORPORATION, Melbourne, FL (US)

(72) Inventors: Timothy Giles, Brockport, NY (US); William Nelson Furman, Fairport, NY (US); Nicholas Shields, Victor, NY (US); Nathan T. Prosser, Rochester, NY (US); Richard Taylor, Moneta, VA (US); Daniel E. Stephens, Rochester, NY (US)

(73) Assignee: HARRIS CORPORATION, Melbourne, FL (US)

( * ) Notice: Subject to any disclaimer, the term of this patent is extended or adjusted under 35 U.S.C. 154(b) by 246 days.

(21) Appl. No.: 13/957,066

(22) Filed: Aug. 1, 2013

(65) Prior Publication Data
US 2015/0038099 A1 Feb. 5, 2015

(51) Int. Cl.
*H04B 1/12* (2006.01)
*H04B 1/00* (2006.01)
*H04L 27/38* (2006.01)
*H04B 1/30* (2006.01)
*H03D 1/22* (2006.01)

(52) U.S. Cl.
CPC .............. *H04B 1/123* (2013.01); *H04B 1/0032* (2013.01); *H04B 1/30* (2013.01); *H04L 27/3863* (2013.01); *H03D 1/2245* (2013.01)

(58) Field of Classification Search
CPC combination set(s) only.
See application file for complete search history.

(56) References Cited

U.S. PATENT DOCUMENTS

| 7,965,988 | B2 | 6/2011 | Cole et al. |
| 7,974,593 | B2 | 7/2011 | Cole et al. |
| 8,018,990 | B2 | 9/2011 | Lee et al. |
| 8,077,797 | B2 | 12/2011 | Sorrells et al. |
| 8,229,023 | B2 | 7/2012 | Sorrells et al. |
| 8,279,975 | B2 | 10/2012 | Caruthers et al. |
| 8,340,225 | B2 | 12/2012 | Khoshgard et al. |
| 2006/0079195 | A1 | 4/2006 | Beamish et al. |
| 2007/0280380 | A1 | 12/2007 | Cho et al. |
| 2008/0158433 | A1 | 7/2008 | Yun et al. |
| 2010/0215125 | A1 | 8/2010 | Furman |
| 2011/0064166 | A1* | 3/2011 | Khoshgard et al. ........... 375/324 |

OTHER PUBLICATIONS

Nezami, "Performance assessment of baseband algorithms for direct conversion tactical software defined receivers: I/Q imbalance correction, image rejection, DC removal, and channelization", IEEE, 2002, pp. 369-376.

* cited by examiner

*Primary Examiner* — Junpeng Chen
(74) *Attorney, Agent, or Firm* — Allen, Dyer, Doppelt, Milbrath & Gilchrist, P.A.

(57) ABSTRACT

A direct conversion receiver device may receive I and Q signals. The direct conversion receiver device may include a blind IQ balance circuit configured to balance the I and Q signals without a pilot signal, and a mixer coupled to the blind IQ balance circuit and configured to generate I and Q baseband signals using an operational frequency, the operational frequency being based upon bandwidth and modulation of the I and Q signals. The blind IQ balance circuit may include a first stage configured to generate an intermediate amplitude balanced Q signal based upon the I and Q signals, and a second stage coupled to the first stage and configured to generate phased balanced I and Q signals based upon the intermediate amplitude balanced Q signal and the I signal.

27 Claims, 5 Drawing Sheets

DIRECT CONVERSION RECEIVER DEVICE WITH FIRST AND SECOND STAGES AND RELATED METHODS

FIELD OF THE INVENTION

The present invention relates to the field of communications, and, more particularly, to direct conversion communications devices and related methods.

BACKGROUND OF THE INVENTION

Mobile communications devices have become an integral part of society over the last two decades. The typical mobile communications device includes an antenna, and a transceiver coupled to the antenna. The transceiver and the antenna cooperate to transmit and receive communications signals.

Before transmission, the typical mobile communications device modulates analog voice or digital data onto a radio frequency (RF) signal. As will be readily appreciated by the skilled person, there is a plurality of modulations available for most applications. Some particularly advantageous modulations include, for example, continuous phase modulation (CPM). The constant envelope characteristics of this modulation provide for lower energy demands on the power amplifier of mobile communications devices, for example, by reducing the peak-to-average power ratio (PAPR), increasing average transmit power (providing greater transmission range), and increasing amplifier efficiency, i.e. allowing the use of non-linear amplifiers such as Class C amplifiers. Moreover, CPM provides for efficient use of available bandwidth.

On the other end of the transmission, the receiver device receives the modulated signal. The receiver demodulates the modulated signal, which is then subject to further baseband level processing. Typically, the carrier frequency of the modulated signal is much greater than the bandwidth of the corresponding baseband signals. Accordingly, when the modulated signal is received, the receiver device downconverts the signal frequency to the baseband frequency range.

One approach to communications comprises using a superheterodyne receiver. This approach uses frequency mixing to convert the received signal to a fixed intermediate frequency. The signal is then more readily processed at the fixed intermediate frequency. A potential drawback to this approach is that a superheterodyne receiver may comprise several band pass filters and local frequency sources that increase size, weight, power consumption, and cost.

Another approach to communications is a direct conversion (homodyne) receiver. The direct conversion receiver demodulates the received signal using synchronous detection. The synchronous detection is based upon a local oscillator operating at a frequency close to or identical to the carrier frequency of the received signal. The direct conversion receiver is also known as a zero-intermediate frequency device, since the intermediate frequency conversion stage is omitted.

Although the direct conversion receiver has fewer components than its superheterodyne counterpart, the direct conversion receiver may suffer from other drawbacks. For example, the handling of dynamic range in direct conversion receivers can be complex. Also, direct conversion receivers may suffer from less desirable performance due to direct current (DC) offset of hardware components induced by large RF blockers. This potential drawback can be worsened when the baseband signal out of the receiver has usable spectral components near DC.

One approach to these drawbacks comprises shifting the waveform spectrum away from DC and then applying a high pass filter to the baseband signals to remove the DC component. Nonetheless, this approach has its own drawbacks. For example, unlike direct conversion receivers that have outputs centered at DC, adjacent channel signals create frequency images of the interference that may lie close to, or even overlay the desired signal spectrum. It may be difficult if not impossible to reject the interference image post-receiver by analog or digital filtering. Reduction of this interference image to acceptable levels to meet public safety industry standard interference rejection standards may require precise matching of the phase and gain of the in-phase (I) and quadrature (Q) baseband signals. However, the requisite degree of matching that is required cannot be achieved and/or maintained with commercially available direct conversion receiver circuitry, even if hand-selected to maximize the degree of matching.

One approach to IQ balancing is disclosed in U.S. Pat. No. 8,340,225 to Khoshgard et al. This approach comprises a gain stage, and a phase stage. The I and Q signals are amplitude balanced in the first gain stage, and then output into the second phase stage. The second phase stage phase balances the amplitude balanced I and Q signals.

SUMMARY OF THE INVENTION

In view of the foregoing background, it is therefore an object of the present invention to provide a direct conversion receiver device that may simultaneously provide an approach to the problem of DC offset as well as maintaining the requisite IQ balance for the public safety application that may require precise I and Q balancing over environment variations and time, for a wide variety of public safety waveforms.

These and other objects, features, and advantages in accordance with the present invention are provided by a direct conversion receiver device for receiving I and Q signals. The direct conversion receiver device comprises a blind IQ balance circuit configured to balance the I and Q signals without a pilot signal, and a mixer coupled to the blind IQ balance circuit and configured to generate I and Q baseband signals using an operational frequency, the operational frequency being based upon bandwidth and modulation of the I and Q signals. The blind IQ balance circuit comprises a first stage configured to generate an intermediate amplitude balanced Q signal based upon the I and Q signals. The blind IQ balance circuit comprises a second stage coupled to the first stage and configured to generate phase balanced I and Q signals based upon the intermediate amplitude balanced Q signal and the I signal. Advantageously, the direct conversion receiver device may readily, continuously, and blindly balance received I and Q signals.

Another aspect is directed to a method for balancing I and Q signals received at a direct conversion receiver device and without a pilot signal. The method includes generating an intermediate amplitude balanced Q signal based upon the I and Q signals with a first stage in the direct conversion receiver device, and generating phased balanced I and Q signals based upon the intermediate amplitude balanced Q signal and the I signal with a second stage in the direct conversion receiver device and coupled to the first stage. The method also includes generating I and Q baseband signals from the phased balanced I and Q signals using an operational frequency of a mixer coupled to the second stage, the operational frequency being based upon bandwidth and modulation of the I and Q signals.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
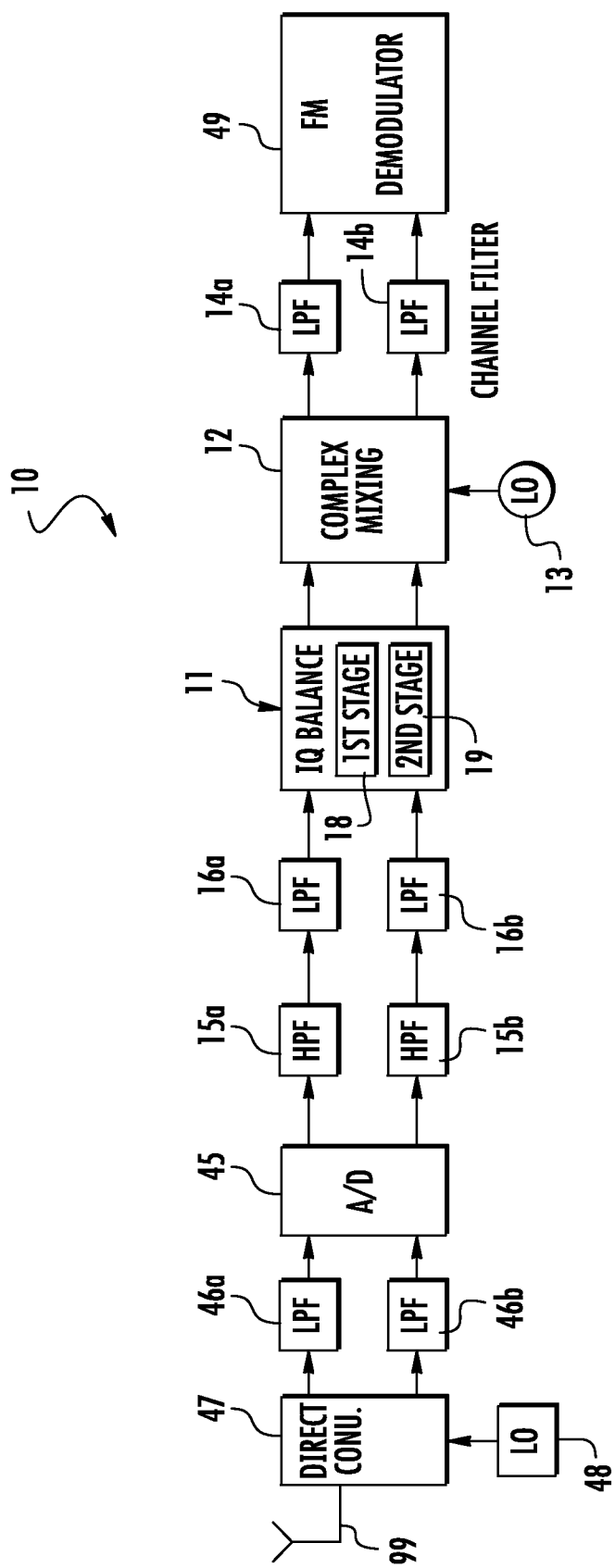
FIG. 1 is a schematic diagram of a direct conversion receiver device, according to the present invention.

Referring initially to FIG. 1, a direct conversion receiver device 10 according to the present invention is now described. The direct conversion receiver device 10 is designed to receive RF signals and directly downconvert to I and Q baseband signals. For example, the I and Q signals may be modulated based upon a Quadrature amplitude modulation (QAM), such as 16-QAM, or 64-QAM.

The direct conversion receiver device 10 illustratively includes an antenna 99 to receive an RF signal, a direct downconverter 47 coupled downstream from the antenna, a local oscillator 48 coupled to the direct downconverter, and first and second low pass filters 46a-46b coupled downstream from the direct downconverter. The direct downconverter 47 is configured to generate analog I and Q signals. The direct conversion receiver device 10 illustratively includes an analog-to-digital converter 45 configured to generate I and Q signals.

The direct conversion receiver device 10 comprises a blind IQ balance circuit 11 configured to balance the I and Q signals without a pilot signal (i.e. without a known element in the received signal), and a mixer 12 coupled to the blind IQ balance circuit and configured to generate I and Q baseband signals. The direct conversion receiver device 10 illustratively includes first and second band pass filters coupled upstream of the blind IQ balance circuit 11. In this embodiment, the first and second band pass filters each comprises a high pass filter 15a-15b coupled downstream from the analog-to-digital converter 45, and a low pass filter downstream 16a-16b therefrom. The frequency selectivity of these filters 15a-16b, 16a-16b is adjusted based on the receive signal bandwidth and modulation, by reducing the bandwidth of the signal before the blind IQ balance circuit 11, further improvements in the performance of the system can be realized above the performance improvements that are realized using the blind IQ balance alone. The direct conversion receiver device 10 comprises third and fourth low pass filters 14a-14b coupled downstream of the blind IQ balance circuit 11, a local oscillator 13 coupled to the mixer 12 and configured to produce the operational frequency for the mixer, and an FM demodulator 49 coupled downstream from the third and fourth low pass filters 14a-14b.

The mixer 12 is configured to generate the I and Q baseband signals using an operational frequency, the operational frequency being based upon bandwidth and modulation of the I and Q signals. In particular, the operational frequency of the local oscillator 13 (i.e. the near zero intermediate frequency (NZIF)) is chosen based upon the receive signal bandwidth and modulation to minimize interference from adjacent channel signals due to IQ imbalance. The following selection criteria is used: frequency is sufficiently above 0 Hz to allow high pass filtering (15a and 15b) to remove DC offset without significantly distorting the signal spectrum; and frequency is less than half of the channel spacing. When NZIF frequency is equal to half of the channel spacing, the interference from adjacent channel signals due to IQ imbalance is maximized.

Figure 2:
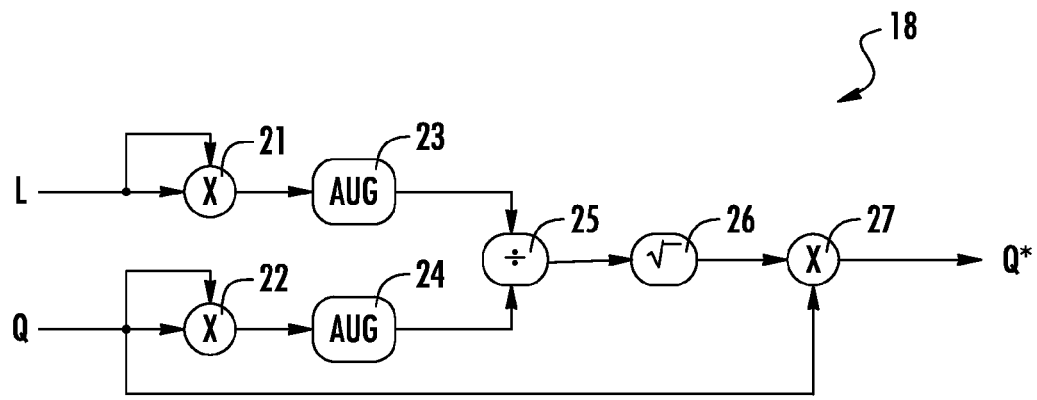
FIG. 2 is a schematic diagram of a first stage of the blind IQ balance circuit from the direct conversion receiver device of FIG. 1.
Figure 3:
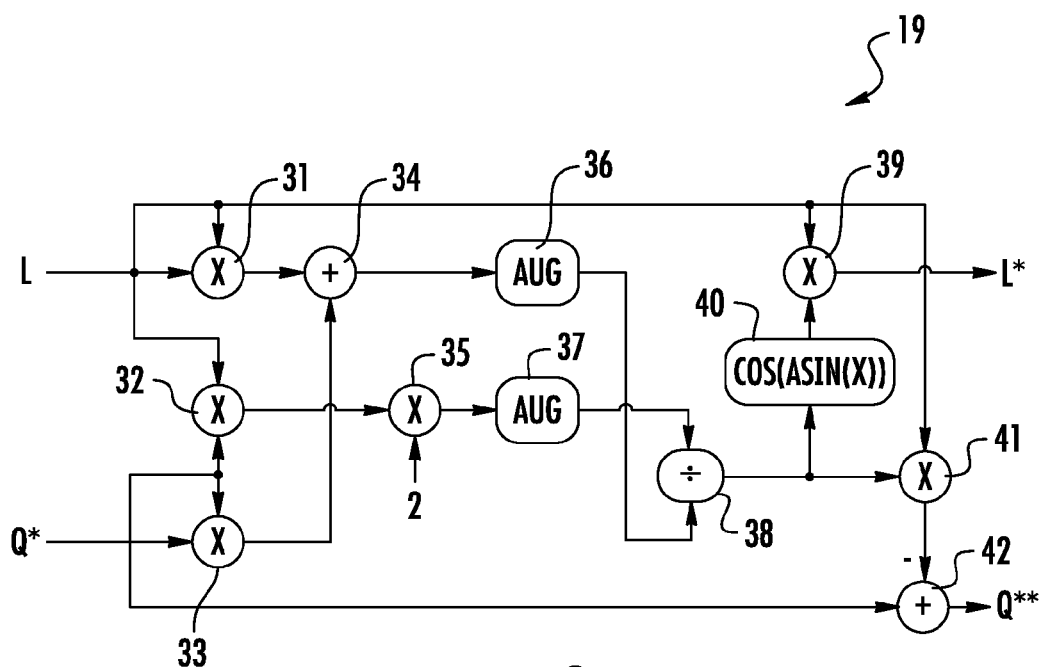
FIG. 3 is a schematic diagram of a second stage of the blind IQ balance circuit from the direct conversion receiver device of FIG. 1.

Referring now additionally to FIG. 2-3, the blind IQ balance circuit 11 comprises a first stage 18 configured to generate an intermediate amplitude balanced Q signal (Q*) based upon the I and Q signals (I & Q), and a second stage 19 coupled to the first stage and configured to generate phased balanced I and Q signals (I*, Q**) based upon the intermediate amplitude balanced Q signal (Q*) and the I signal.

More particularly, the first stage 18 comprises first and second multipliers 21-22 configured to respectively generate squares of the I and Q signals, and first and second average circuits 23-24 respectively coupled to the first and second multipliers. The first stage 18 also comprises a first divider circuit 25 downstream from the first and second average circuits 23-24 and configured to generate a combined signal based upon the averaged and squared I and Q signals, and a square root circuit 26 downstream from the first divider circuit. The first stage 18 includes a third multiplier 27 downstream from the square root circuit 26 and configured to multiply the combined signal (square root thereof) by the Q signal to generate the intermediate amplitude balanced Q signal (Q*).

The first stage 18 is responsible for the balancing of the amplitude of the I and Q signals. The first stage 18 operates based upon the following amplitude correction formula (formula 1).

$$Q^* = \frac{\sqrt{\text{average}(I^2)}}{\sqrt{\text{average}(Q^2)}} \times Q \quad (1)$$

The second stage 19 is responsible for the balancing of the phase of the I and Q signals. The second stage 19 operates based upon the following phase correction formulas (formulas 2-4).

$$\sin(\theta) = \frac{\text{average}(2 \times I \times Q*)}{\text{average}(I^2 + Q^{*2})} \quad (2)$$

$$I^* = I \times \cos(\sin^{-1}(\sin(\theta))) \quad (3)$$

$$Q^{**} = Q^* - (I \times \sin(\theta)) \quad (4)$$

Additionally, the second stage 19 comprises fourth and fifth multipliers 31, 33 configured to respectively square the I signal and the intermediate amplitude balanced Q signal, and a sixth multiplier 32 configured to multiply the I signal and the intermediate amplitude balanced Q signal. The second stage 19 also comprises a first summer 34 configured to sum the squared I signal and the squared intermediate amplitude balanced Q signal, and first and second average circuits 36-37 coupled respectively to the first summer and the sixth multiplier 32 via a ninth multiplier (doubler-2) 35 that multiplies by a constant 2. The second stage 19 comprises a second divider circuit 38 coupled to the first and second average circuits 36-37.

Moreover, the second stage 19 comprises a seventh multiplier 41 coupled downstream of the second divider circuit and configured to multiply a divided signal from the second divider circuit and the I signal, and a second summer 42 configured to sum an output (negated in the illustrated embodiment) of the seventh multiplier and the intermediate amplitude balanced Q signal (Q*) to generate the phase balanced Q signal (Q**). The second stage 19 comprises a cosine circuit 40 coupled to the second divider circuit 38, and a eighth multiplier 39 configured to multiply an output of the cosine circuit and the I signal to generate the phase balanced I signal.

Figure 4:
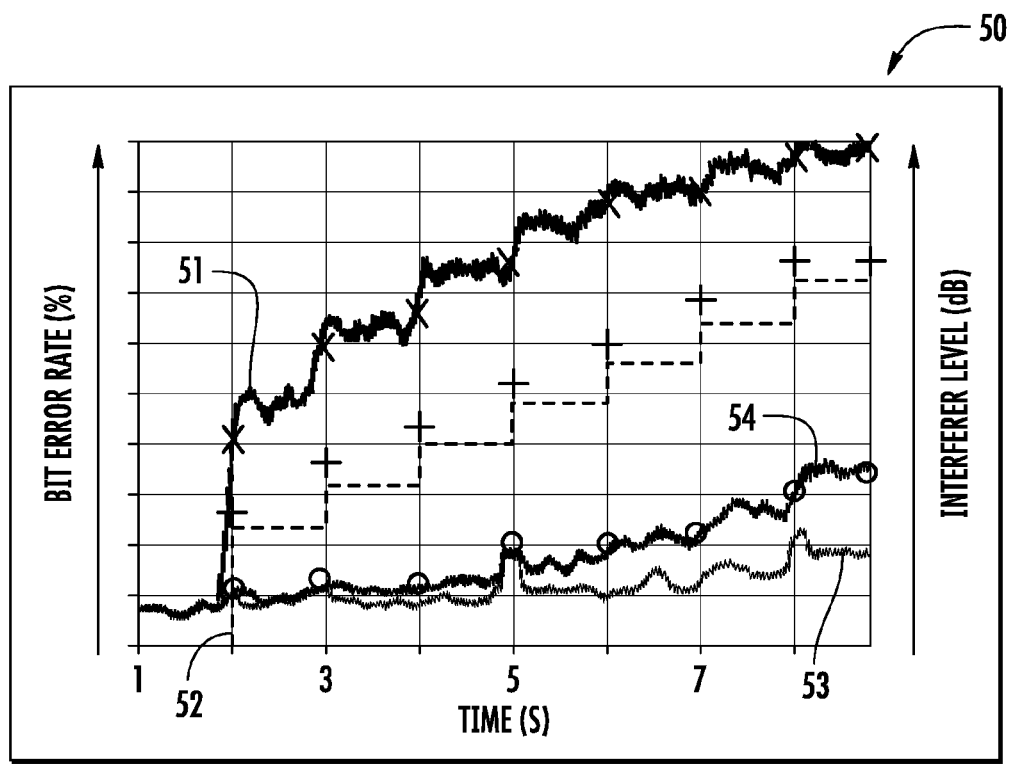
FIG. 4 is a diagram of performance for rejecting adjacent channel interferers in the direct conversion receiver device of FIG. 1.
Figure 5:
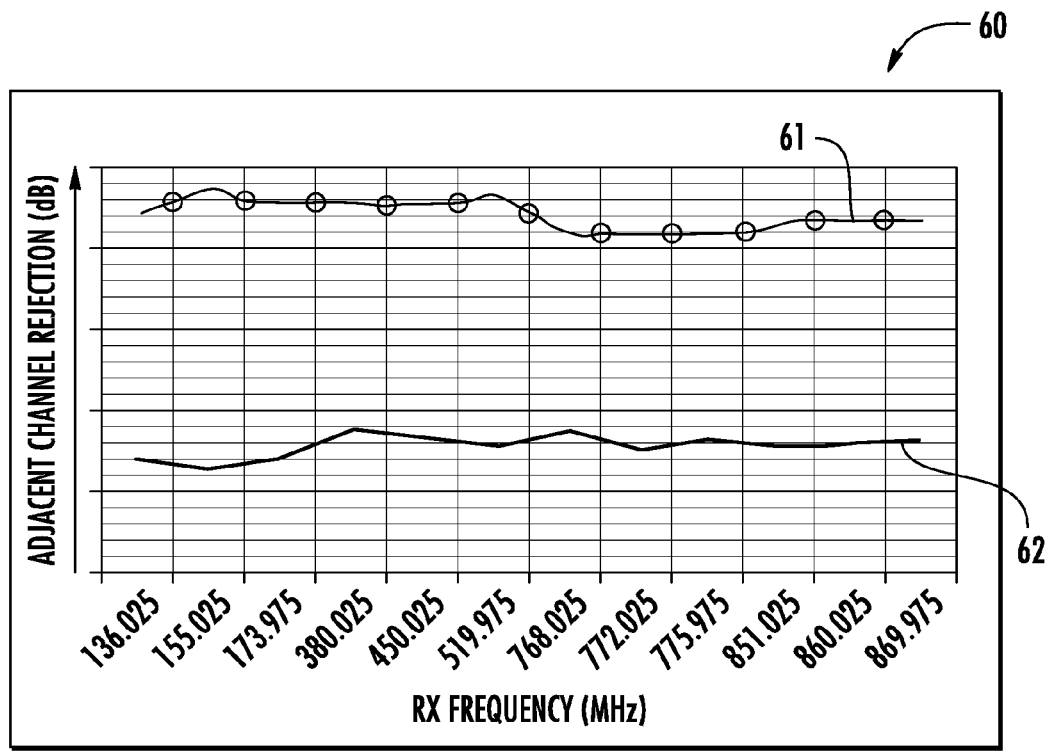
FIG. 5 is another diagram of performance for rejecting adjacent channel interferers in the direct conversion receiver device of FIG. 1.

Referring now to FIGS. 4-5, diagrams 50, 60 illustrate performance of the direct conversion receiver device 10. Diagram 50 illustratively shows the performance of the algorithm of the direct conversion receiver device 10 in the presence of an adjacent channel interferer 52 whose image power due to IQ imbalance causes receiver desensitization. The algorithm was run in a computer simulation on samples recorded from a radio device. Curve 51 shows the bit error rate without utilizing blocks 15a, 15b, 16a, 16b, 11 (FIG. 1). Curve 54 shows the bit error rate utilizing only the blind IQ balance circuit 11 in FIG. 1. Curve 53 shows the bit error rate utilizing all the blocks 15a, 15b, 16a, 16b and 11 from FIG. 1.

Diagram 60 (FIG. 5) shows the performance measurements on a land mobile radio test device at various receive frequencies. Curve 62 shows the adjacent channel rejection without utilizing blocks 15a, 15b, 16a, 16b (FIG. 1) on the I and Q signals, and curve 61 shows the adjacent channel rejection utilizing all the blocks of FIG. 1 on the I and Q signals.

Figure 6:
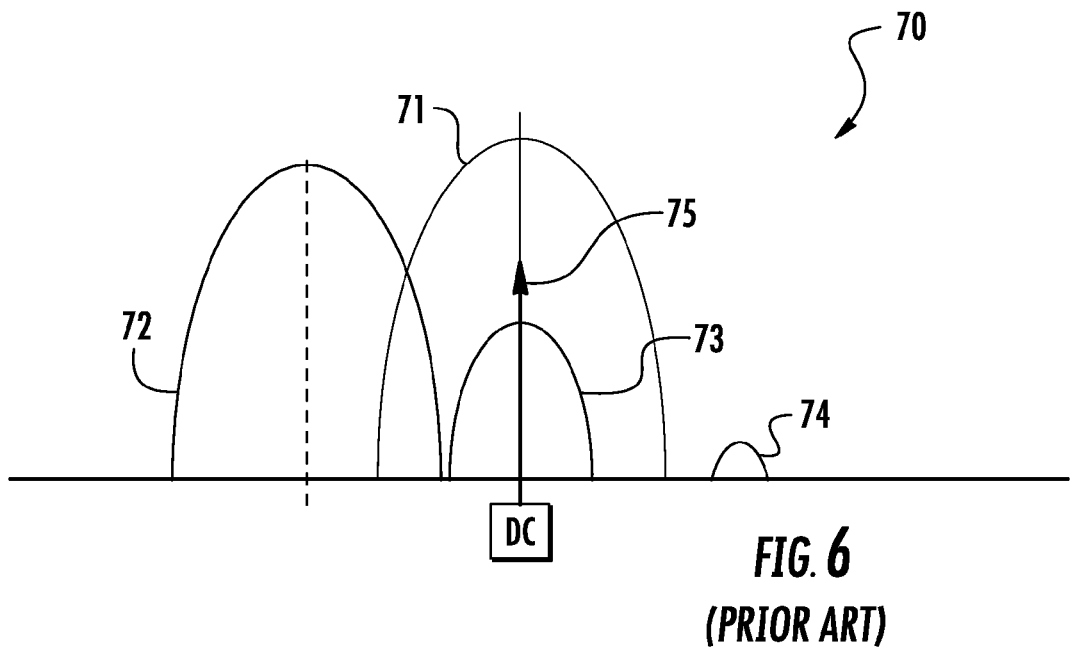
FIG. 6 is a frequency spectrum diagram for a direct conversion receiver with an adjacent channel interferer present, according to the prior art.
Figure 7:
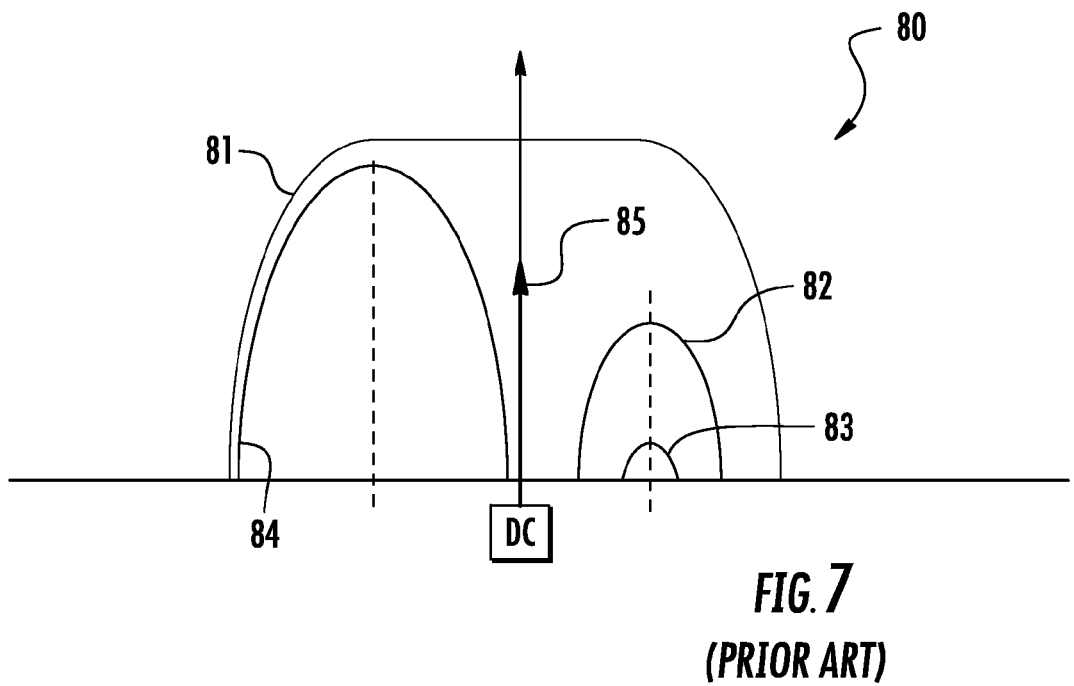
FIG. 7 is a frequency spectrum diagram for a direct conversion receiver with a near zero intermediate frequency equal to half of the channel spacing with an adjacent channel interferer present, according to prior art.
Figure 8:
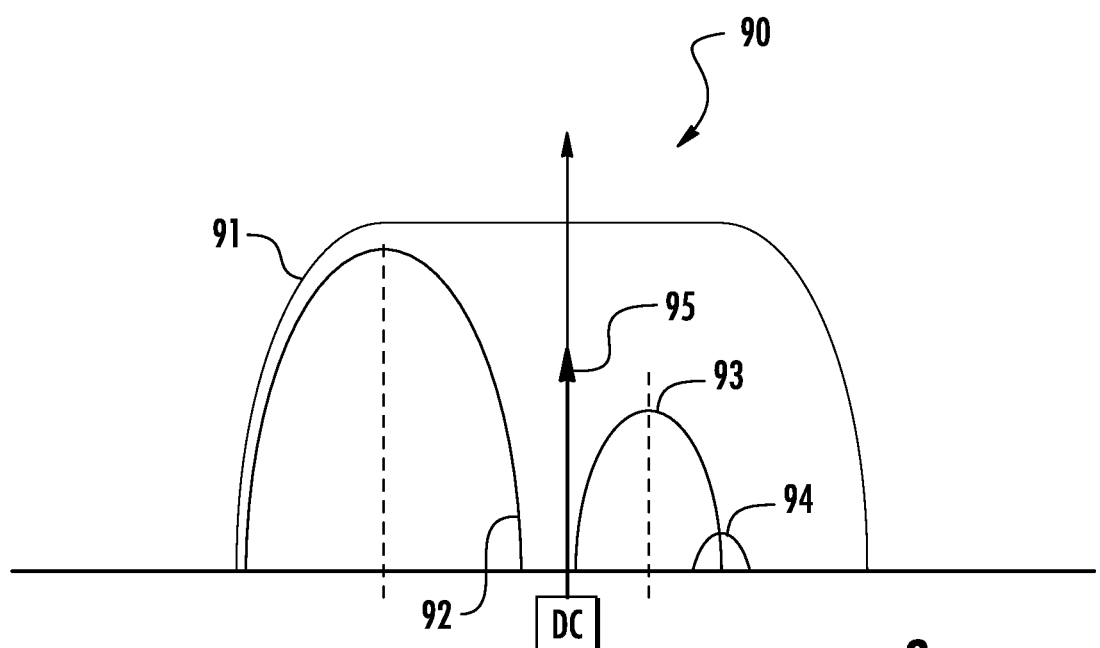
FIG. 8 is a frequency spectrum diagram for the direct conversion receiver device of FIG. 1 with an adjacent channel interferer present.

Referring now additionally to FIGS. 6-8, diagrams 70, 80 illustrate the frequency spectrum in a typical prior art direct conversion receiver device. Diagram 90 illustrates the frequency spectrum in the direct conversion receiver device 10 of the present invention. Curve 71 represents the frequency response of the direct conversion receiver device's low pass channel filter (46a, 46b in FIG. 1). Curve 72 represents the unwanted adjacent channel interferer signal whose frequency is a channel spacing below the wanted signal. Curve 73 represents the wanted signal centered at 0 Hz. Curve 74 represents the adjacent channel interferer image resulting from IQ mismatch whose frequency is a channel spacing above the wanted signal. Line 75 represents the signal power of a DC offset. As will be appreciated, the DC offset 75 directly interferes with the wanted signal 73, reducing the receiver sensitivity.

Diagram 80 illustrates another application of the typical direct conversion receiver device used for NZIF reception. Curve 81 represents the frequency response of the low pass channel filter (46a, 46b in FIG. 1). Curve 84 represents the unwanted adjacent channel interferer signal centered one channel spacing below the wanted signal 82. Curve 82 represents the wanted signal centered at the NZIF of half the channel spacing. Curve 83 represents the adjacent channel interferer image resulting from IQ mismatch, centered at the near zero intermediate frequency. Line 85 represents the signal power of the DC offset. As will be appreciated, the image from the interferer directly, if not substantially reduced by the present invention, interferes with the wanted signal, reducing receiver sensitivity.

In diagram 90, curve 91 represents the frequency response of the low pass channel filter. Curve 92 represents the unwanted interferer signal centered at one channel spacing below the wanted signal. Curve 93 represents the wanted signal whose frequency is sufficiently above the DC component 95 and less than half of the channel spacing. Curve 94 represents the adjacent channel interferer image resulting from IQ mismatch (after processing in the blind IQ balance circuit 11). As will be appreciated, the image (curve 94) from the interferer has been advantageously shifted to be partially outside the spectrum of the wanted signal (curve 93).

Advantageously, the algorithm of the direct conversion receiver device 10 is a feed-forward approach that can converge on an accurate answer more quickly in small signal conditions. Moreover, the performance of the algorithm of the direct conversion receiver device 10 is improved by first filtering the I and Q signals, thereby only the energy of the on channel and its image is processed by the IQ balancing algorithm. The direct conversion receiver device 10 implements blind IQ balancing with improved performance due to the band pass filtering of the adjacent channel interferer and adaptive NZIF frequency adjustment. Also, the direct conversion receiver device 10 may enable manufacture of communications devices that are smaller and cheaper. Also, the direct conversion receiver device 10 may intelligently choose a NZIF frequency based on channel bandwidth, and band pass filter the signals applied to the balancing algorithm.

Other features relating to communication devices are disclosed in co-pending application titled "COMMUNICATIONS DEVICE WITH IN-PHASE/QUADRATURE (I/Q) DC OFFSET, GAIN AND PHASE IMBALANCE COMPENSATION AND RELATED METHOD," application Ser. No. 12/392,199, which is incorporated herein by reference in its entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A direct conversion receiver device for receiving in-phase (I) and quadrature (Q) signals, the direct conversion receiver device comprising:
 a blind IQ balance circuit configured to balance the I and Q signals without a pilot signal comprising a first stage configured to generate an intermediate amplitude balanced Q signal based upon the I and Q signals, and a second stage coupled to said first stage and configured to generate phased balanced I and Q signals based upon the intermediate amplitude balanced Q signal and the I signal; and a mixer coupled to said blind IQ balance circuit and configured to generate I and Q baseband signals using an operational frequency, the operational frequency being based upon bandwidth and modulation of the I and Q signals, and less than half of a spacing value between the I and Q signals and an adjacent channel.

2. The direct conversion receiver device of claim 1 wherein said first stage comprises first and second multipliers configured to respectively generate squares of the I and Q signals, and first and second average circuits respectively coupled to said first and second multipliers.

3. The direct conversion receiver device of claim 2 wherein said first stage comprises a first divider circuit downstream from said first and second average circuits and configured to generate a combined signal based upon the averaged and squared I and Q signals, and a square root circuit downstream from said first divider circuit.

4. The direct conversion receiver device of claim 3 wherein said first stage comprises a third multiplier downstream from said square root circuit and configured to multiply the combined signal by the Q signal to generate the intermediate amplitude balanced Q signal.

5. The direct conversion receiver device of claim 1 wherein said second stage comprises fourth and fifth multipliers configured to respectively square the I signal and the intermediate amplitude balanced Q signal, and a sixth multiplier configured to multiply the I signal and the intermediate amplitude balanced Q signal.

6. The direct conversion receiver device of claim 5 wherein said second stage comprises a first summer configured to sum the squared I signal and the squared intermediate amplitude balanced Q signal, and first and second low pass filters coupled respectively to said first summer and said sixth multiplier.

7. The direct conversion receiver device of claim 6 wherein said second stage comprises a second divider circuit coupled to said first and second low pass filters.

8. The direct conversion receiver device of claim 7 wherein said second stage comprises a seventh multiplier coupled downstream of said second divider circuit and configured to multiply a divided signal from said second divider circuit and the I signal, and a second summer configured sum an output of said seventh multiplier and the intermediate amplitude balanced Q signal to generate the phase balanced Q signal.

9. The direct conversion receiver device of claim 7 wherein said second stage comprises a cosine circuit coupled to said second divider circuit, and a eighth multiplier configured to multiply an output of said cosine circuit and the I signal to generate the phase balanced I signal.

10. The direct conversion receiver device of claim 1 further comprising first and second band pass filters coupled upstream of said blind IQ balance circuit, and first and second low pass filters coupled downstream of said blind IQ balance circuit.

11. A blind in-phase (I) quadrature (Q) balance device for balancing I and Q signals without a pilot signal at a direct conversion receiver device, the blind IQ balance device comprising:

a first stage configured to generate an intermediate amplitude balanced Q signal based upon the I and Q signals; and a second stage coupled to said first stage and configured to generate phased balanced I and Q signals based upon the intermediate amplitude balanced Q signal and the I signal, the phased balanced I and Q signals to be used to generate I and Q baseband signals using an operational frequency, the operational frequency being based upon bandwidth and modulation of the I and Q signals, and less than half of a spacing value between the I and Q signals and an adjacent channel.

12. The blind IQ balance device of claim 11 wherein said first stage comprises first and second multipliers configured to respectively generate squares of the I and Q signals, and first and second average circuits respectively coupled to said first and second multipliers.

13. The blind IQ balance device of claim 12 wherein said first stage comprises a first divider circuit downstream from said first and second average circuits and configured to generate a combined signal based upon the averaged and squared I and Q signals, and a square root circuit downstream from said first divider circuit.

14. The blind IQ balance device of claim 13 wherein said first stage comprises a third multiplier downstream from said square root circuit and configured to multiply the combined signal by the Q signal to generate the intermediate amplitude balanced Q signal.

15. The blind IQ balance device of claim 11 wherein said second stage comprises fourth and fifth multipliers configured to respectively square the I signal and the intermediate amplitude balanced Q signal, and a sixth multiplier configured to multiply the I signal and the intermediate amplitude balanced Q signal.

16. The blind IQ balance device of claim 15 wherein said second stage comprises a first summer configured to sum the squared I signal and the squared intermediate amplitude balanced Q signal, and first and second low pass filters coupled respectively to said first summer and said sixth multiplier.

17. A method for balancing in-phase (I) and quadrature (Q) signals received at a direct conversion receiver device and without a pilot signal, the method comprising:

generating an intermediate amplitude balanced Q signal based upon the I and Q signals with a first stage in the direct conversion receiver device;

generating phased balanced I and Q signals based upon the intermediate amplitude balanced Q signal and the I signal with a second stage in the direct conversion receiver device and coupled to the first stage; and generating I and Q baseband signals from the phased balanced I and Q signals using an operational frequency of a mixer coupled to the second stage, the operational frequency being based upon bandwidth and modulation of the I and Q signals, and less than half of a spacing value between the I and Q signals and an adjacent channel.

18. The method of claim 17 further comprising generating squares of the I and Q signals using the first stage, and generating averages for the squared I and Q signals.

19. The method of claim 18 further comprising generating a combined signal based upon the averaged and squared I and Q signals using the first stage, and generating a square root of the combined signal.

20. The method of claim 19 further comprising multiplying the combined signal by the Q signal and generating the intermediate amplitude balanced Q signal using the first stage.

21. The method of claim 17 further comprising squaring the I signal and the intermediate amplitude balanced Q signal using the second stage, and multiplying the I signal and the intermediate amplitude balanced Q signal.

22. The method of claim 21 further comprising summing the squared I signal and the squared intermediate amplitude balanced Q signal.

23. A direct conversion receiver device for receiving in-phase (I) and quadrature (Q) signals, the direct conversion receiver device comprising:
a blind IQ balance circuit configured to balance the I and Q signals without a pilot signal comprising
a first stage configured to generate an intermediate amplitude balanced Q signal based upon the I and Q signals and comprising
first and second multipliers configured to respectively generate squares of the I and Q signals, and
first and second average circuits respectively coupled to said first and second multipliers, and
a second stage coupled to said first stage and configured to generate phased balanced I and Q signals based upon the intermediate amplitude balanced Q signal and the I signal; and
a mixer coupled to said blind IQ balance circuit and configured to generate I and Q baseband signals using an operational frequency, the operational frequency being based upon bandwidth and modulation of the I and Q signals.

24. A direct conversion receiver device for receiving in-phase (I) and quadrature (Q) signals, the direct conversion receiver device comprising:
a blind IQ balance circuit configured to balance the I and Q signals without a pilot signal comprising
a first stage configured to generate an intermediate amplitude balanced Q signal based upon the I and Q signals, and
a second stage coupled to said first stage and configured to generate phased balanced I and Q signals based upon the intermediate amplitude balanced Q signal and the I signal, said second stage comprising
first and second multipliers configured to respectively square the I signal and the intermediate amplitude balanced Q signal, and
a third multiplier configured to multiply the I signal and the intermediate amplitude balanced Q signal; and
a mixer coupled to said blind IQ balance circuit and configured to generate I and Q baseband signals using an operational frequency, the operational frequency being based upon bandwidth and modulation of the I and Q signals.

25. A direct conversion receiver device for receiving in-phase (I) and quadrature (Q) signals, the direct conversion receiver device comprising:
a blind IQ balance circuit configured to balance the I and Q signals without a pilot signal comprising
a first stage configured to generate an intermediate amplitude balanced Q signal based upon the I and Q signals, and
a second stage coupled to said first stage and configured to generate phased balanced I and Q signals based upon the intermediate amplitude balanced Q signal and the I signal;
first and second band pass filters coupled upstream of said blind IQ balance circuit;
first and second low pass filters coupled downstream of said blind IQ balance circuit and
a mixer coupled to said blind IQ balance circuit and configured to generate I and Q baseband signals using an operational frequency, the operational frequency being based upon bandwidth and modulation of the I and Q signals.

26. A blind in-phase (I) quadrature (Q) balance device for balancing I and Q signals without a pilot signal at a direct conversion receiver device, the blind IQ balance device comprising:
a first stage configured to generate an intermediate amplitude balanced Q signal based upon the I and Q signals and comprising
first and second multipliers configured to respectively generate squares of the I and Q signals, and
first and second average circuits respectively coupled to said first and second multipliers; and
a second stage coupled to said first stage and configured to generate phased balanced I and Q signals based upon the intermediate amplitude balanced Q signal and the I signal, the phased balanced I and Q signals to be used to generate I and Q baseband signals using an operational frequency, the operational frequency being based upon bandwidth and modulation of the I and Q signals.

27. A blind in-phase (I) quadrature (Q) balance device for balancing I and Q signals without a pilot signal at a direct conversion receiver device, the blind IQ balance device comprising:
a first stage configured to generate an intermediate amplitude balanced Q signal based upon the I and Q signals; and
a second stage coupled to said first stage and configured to generate phased balanced I and Q signals based upon the intermediate amplitude balanced Q signal and the I signal, said second stage comprising
first and second multipliers configured to respectively square the I signal and the intermediate amplitude balanced Q signal, and
a third multiplier configured to multiply the I signal and the intermediate amplitude balanced Q signal;
the phased balanced I and Q signals to be used to generate I and Q baseband signals using an operational frequency, the operational frequency being based upon bandwidth and modulation of the I and Q signals.

\* \* \* \* \*